(12) United States Patent
Srinivasan et al.

(10) Patent No.: US 11,600,734 B2
(45) Date of Patent: Mar. 7, 2023

(54) AVALANCHE PHOTODIODE DEVICE WITH A CURVED ABSORPTION REGION

(71) Applicant: IMEC VZW, Leuven (BE)

(72) Inventors: Ashwyn Srinivasan, Heverlee (BE); Maria Ioanna Pantouvaki, Kessel-lo (BE); Joris Van Campenhout, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/373,084

(22) Filed: Jul. 12, 2021

(65) Prior Publication Data

US 2022/0013680 A1 Jan. 13, 2022

(30) Foreign Application Priority Data

Jul. 13, 2020 (EP) .................................... 20185443

(51) Int. Cl.
*H01L 31/107* (2006.01)
*H01L 31/028* (2006.01)
(Continued)

(52) U.S. Cl.
CPC .......... *H01L 31/107* (2013.01); *H01L 31/028* (2013.01); *H01L 31/03529* (2013.01); *H01L 31/1808* (2013.01)

(58) Field of Classification Search
CPC ................. H01L 31/107; H01L 31/028; H01L 31/03529; H01L 31/1808; H01L 31/02327;
(Continued)

(56) References Cited

U.S. PATENT DOCUMENTS

| 2012/0126286 A1 | 5/2012 | Na et al. |
| 2015/0108327 A1 | 4/2015 | Huang et al. |
| 2019/0074397 A1 | 3/2019 | Hassan et al. |

FOREIGN PATENT DOCUMENTS

| CN | 105576072 A | * | 5/2016 | |
| CN | 104025315 B | * | 11/2017 | ............... G02B 6/42 |

(Continued)

OTHER PUBLICATIONS

Alloatti, L., et al., "Resonance-Enhanced Waveguide-Coupled Silicon-Germanium Detector", Appl. Phys. Lett., 2016, vol. 108, pp. 071105-1 to 071105-4.

(Continued)

*Primary Examiner* — Sitaramarao S Yechuri
(74) *Attorney, Agent, or Firm* — McDonnell Boehnen Hulbert & Berghoff LLP

(57) ABSTRACT

An avalanche photodiode (APD) device, in particular, a lateral separate absorption charge multiplication (SACM) APD device, and a method for its fabrication is provided. The APD device comprises a first contact region and a second contact region formed in a semiconductor layer. Further, the APD device comprises an absorption region formed on the semiconductor layer, wherein the absorption region is at least partly formed on a first region of the semiconductor layer, wherein the first region is arranged between the first contact region and the second contact region. The APD device further includes a charge region formed in the semiconductor layer between the first region and the second contact region, and an amplification region formed in the semiconductor layer between the charge region and the second contact region. At least the absorption region is curved on the semiconductor layer.

17 Claims, 9 Drawing Sheets

(51) Int. Cl.
*H01L 31/0352* (2006.01)
*H01L 31/18* (2006.01)

(58) Field of Classification Search
CPC ......... H01L 31/035281; H01L 31/1075; H01L 31/18
See application file for complete search history.

(56) References Cited

FOREIGN PATENT DOCUMENTS

| | | | | |
|---|---|---|---|---|
| CN | 110246903 A | * | 9/2019 | ....... H01L 31/02027 |
| EP | 1292855 B1 | | 2/2004 | |
| EP | 3029728 A1 | | 6/2016 | |
| JP | 2015-046429 A | | 3/2015 | |

OTHER PUBLICATIONS

Srinivasan, S.A., et al., "27 GHz Silicon-Contacted Waveguide-Coupled Ge/Si Avalanche Photodiode", Journal of Lightwave Technology, (2020), vol. 38(11), pp. 3044-3050.
Extended European Search Report from the European Patent Office, dated Nov. 12, 2020, for European Patent Application No. 20185443.7, pp. 1-37.

* cited by examiner

AVALANCHE PHOTODIODE DEVICE WITH A CURVED ABSORPTION REGION

CROSS-REFERENCE

The present application claims priority from European Patent Application No. 20185443.7, filed Jul. 13, 2020, which is incorporated by reference in its entirety.

TECHNICAL FIELD

The present disclosure relates to photodetectors and specifically to avalanche photodetectors, and targets applications for optical communication, light sensing or quantum communication. The present disclosure proposes an avalanche photodiode (APD) device, in particular, a separate absorption charge multiplication (SACM) APD device, and a method for its fabrication. The APD device presented by this disclosure may be a lateral SACM APD device with curved absorption region.

BACKGROUND OF THE DISCLOSURE

In the above-given technical field of APD devices (e.g., used as photodetectors for optical communication, light sensing, or quantum communication), receiver sensitivity and operating data rates are crucial requirements for performance, as they determine the power consumption of the optical communication link. APD devices can have great potential to enable these requirements, thus realizing sensitive receivers which allow for high operating data rates.

APD devices are typically realized in two device architectures. The first device architecture is a standard pin form, and is also referred to as pin-APD device. The second device architecture is a p+/p−/n+ form, which is also referred to as SACM APD device. In the standard pin APD devices, a light absorption and a multiplication of carriers due to the avalanche effect occur in an intrinsic region of the diode. However, in SACM APD devices, an absorption region and a multiplication region of the diode are separated by a charge region (e.g., the p− doped region of the p+/p−/n+ diode). While standard pin APD devices have the potential for low operating voltages, SACM APD devices have a higher sensitivity and can operate at higher speeds. Thus, SACM APD devices are more attractive for optical interconnections, optical communication, local optical quantum computing, quantum communication, terahertz communication, terahertz imaging, or sensing.

Two parameters that influence receiver sensitivity are the dark current of the APD device and the gain-bandwidth product. To be precise, an APD device with low dark current, high gain, and high bandwidth would be ideal. However, surface illuminated and waveguide integrated avalanche photodiodes, always have a tradeoff between the dark current and the bandwidth. Devices with lower dark current also have lower bandwidth (for a fixed gain). This tradeoff between dark current and bandwidth can be a bottleneck for scaling the device performance for future system targets.

Therefore, new device concepts for SACM APD devices, which allow for a lower dark current while at the same time increasing (or at least not decreasing) the bandwidth are desired.

SUMMARY OF THE DISCLOSURE

The present disclosure is further based on the following considerations regarding SACM APD devices. Conventionally, SACM APD devices are realized in a vertical formation, which either requires dedicated epitaxially grown stacks or contacts on the absorption region. Such vertical SACM APD devices with dedicated epitaxially grown stacks can be hard to integrate into existing silicon photonics platforms, due to the epitaxy complexity. Further, the vertical designs also require contacting schemes on the absorption region, which can be a yield issue. Moreover, the epitaxially grown stacks restrict the freedom in designing the devices, as every design generally requires a dedicated epitaxy study and epitaxy split.

An example of a different device design is a lateral SACM APD device 10, as shown in FIG. 1. The APD device 10 includes a semiconductor layer 13 (e.g., silicon), in which a first contact region 11 (e.g., a p-doped region), a second contact region 12 (e.g., an n-doped region), a charge region 16 (e.g., a p-doped region), and a multiplication region 17 (or amplification region, e.g., an intrinsic region), and a first region 15 (e.g., an intrinsic region) are formed. An absorption region 14 (e.g., germanium) can be formed on the first region 15. A first contact 18 (e.g., a metal contact) can be provided on the first contact region 11 (particularly on a highly-doped region 11a of the first contact region 11), and a second contact 19 (e.g., a metal contact) can be provided on the second contact region 12 (particularly on a highly-doped region 12a of the second contact region 12).

In the SACM APD device 10, light can be absorbed in the absorption region 14, and an electric field generated due to a reverse bias being applied between the contacts 18 and 19 separates photo-generated carriers, with one type of carriers (typically the electrons) moving to the multiplication region 17. The high reverse bias can also allow for an avalanche of the carriers in the multiplication region 17. The charge region 16 can be used to control/balance the electrical fields in the absorption region 14 and the multiplication region 17, respectively, and thus protecting the typically low-bandgap semiconductor material (e.g., germanium) in the absorption region 14 from the high electrical fields needed in the multiplication region 17.

For such a lateral SACM APD device formation, a designer could design the diode using dedicated masks. However, this SACM APD device can suffer from the above-mentioned tradeoff between dark current and bandwidth (for a fixed gain).

To overcome these problems, the source of, respectively, the dark current and of the reduced speeds (a consequence of the reduced bandwidth) in the exemplary lateral SACM APD device 10 was identified. Both are linked to the charge region 16 of the APD device 10.

In particular, it can be seen from FIG. 2, part (a), that for a fixed width $w_M$=0.2 μm of the multiplication region 17, the dark current depends on the width we of the charge region 16. In particular, a wider charge region 16 reduces the electric field in the absorption region 44 (typically comprising germanium) and hence can leads to a lower dark current (indicated by the arrows) due to defects in the absorption region material. However, as it can be seen from FIG. 2, part (b), at the same time a wider charge region 16 can also reduces the bandwidth of the APD device 10 (indicated by the arrows), because of an increased carrier transit time due to a lower electric field in the absorption region 44, and thus reduces the speed.

FIG. 3 shows the APD device 10 of FIG. 1 again in a top view (b) and in a cross-section (a) along the dashed line in the top view. Further, FIG. 3 indicates electric field lines in the APD device 10, in particular, in the multiplication region 17, in the absorption region 14, and in the first region 15, respectively. It was found that the longest distance, which a charge carrier would need to transit, can be a diagonal length of about 600 nm, which reduces the speed of the APD device 10. Further, all the interfaces of the absorption material—i.e., absorption material/oxide interfaces (oxide may cover the free absorption material surfaces), and absorption material/semiconductor interfaces—and the bulk defects are exposed to the electric field. In addition, the electric field profile can be non-uniform across the absorption region 14, as can be seen in simulations. This can result in a non-uniform carrier velocity and carrier transit times across the absorption region 14.

That is, the identified contributors for dark current and the reduced speeds of the APD device 10 are: 1) long carrier transit times; 2) a non-uniform electric field distribution; and 3) interface and bulk defects exposed to an applied electric field.

In view of the above-mentioned disadvantages and considerations, embodiments of the present disclosure aim to provide an improved APD device and a method for its fabrication. An objective is, in particular, to provide an APD device that has a low dark current, a high gain, and a high bandwidth. To this end, a goal is to eliminate the above-identified contributors 1), 2) and 3) in the lateral SACM APD device 10.

The objective is achieved by the embodiments of the disclosure provided in the enclosed independent claims. Beneficial implementations of these embodiments are defined in the dependent claims.

In particular, embodiments of the disclosure allow reducing the carrier transit length (and thus transit time), without changing the width and thickness of the absorption region. Further, embodiments of the disclosure allow reducing the number of interfaces of the absorption region that are exposed to an electric field. Further, embodiments of the disclosure allow providing a more uniform electric field distribution across the absorption region.

A first aspect of the present disclosure provides an APD device comprising: a first contact region and a second contact region formed in a semiconductor layer; an absorption region formed on the semiconductor layer, wherein the absorption region is at least partly formed on a first region of the semiconductor layer, wherein the first region is arranged between the first contact region and the second contact region; a charge region formed in the semiconductor layer between the first region and the second contact region; and an amplification region formed in the semiconductor layer between the charge region and the second contact region; wherein the absorption region is curved on the semiconductor layer.

Due to the curvature of at least the absorption region of the APD device, the carrier transit time is reduced. Thus, a wider charge region can be used, which decreases the dark current, while at the same time the bandwidth of the APD device can at least be maintained (or even increased). Further, the curvature allows for providing the absorption region with a doping profile, which leads to a more uniform electric field and less interfaces exposed to the electric field. This can further reduce dark current and/or increases bandwidth.

In an implementation form of the APD device, a curvature of the absorption region has a radius parallel to the layer plane of the semiconductor layer.

In an implementation form of the APD device, a curvature of the absorption region has a radius in a range of 1-10 µm, in particular, in a range of 2-5 µm.

It was determined that in this radius range of the curvature, beneficial results are achievable. In particular, the curvature shifts an optical mode in the absorption region from the center to an edge, and thus gives room for providing a doping profile.

In an implementation form of the APD device, the first contact region and the second contact region, and/or the charge region, and/or the amplification region are curved in the layer plane of the semiconductor layer.

This provides a particularly efficient APD device with low dark current and high bandwidth, and also facilitates processing of the APD device.

In an implementation form of the APD device, a curvature of the amplification region, and/or of the first and second contact region, and/or of the charge region, is concentrical with a curvature of the absorption region.

In an implementation form of the APD device, the absorption region comprises an intrinsic part and a doped part arranged side by side.

This doping profile of the absorption region allows for reducing the number of absorption material/oxide interfaces of the absorption region, which are exposed to the electric field. This results in lower dark current and higher device bandwidth. Further, this also allows one to obtain a more uniform electric field distribution in the absorption region. The doping profile is enabled by the curvature of the absorption region.

In an implementation form of the APD device, the absorption region can be partly formed on the first contact region, wherein the intrinsic part can be formed on the first region and the doped part can be formed on the first contact region.

In an implementation form of the APD device, the upper surface of the absorption region can be formed by the doped part.

In an implementation form of the APD device, the doped part of the absorption region can be of the same conductivity type as the first contact region, in particular, is p-type.

In an implementation form of the APD device, the absorption region comprises germanium, in particular comprises intrinsic germanium and doped germanium. The intrinsic germanium may provide the intrinsic part of the absorption region, while the doped germanium provides the doped part.

In an implementation form of the APD device, the absorption region can be formed in an indentation of the semiconductor layer, in particular, in an indentation spanning the first region and a part of the first contact region.

In an implementation form of the APD device, a width of the amplification region can be in a range of 0.05-1 µm; and/or a width of the charge region is in a range of 0.05-0.3 µm.

In particular, a wider charge region than in the exemplary APD device shown in FIG. 1 can be formed.

In an implementation form of the APD device, the amplification region can be formed by an intrinsic region of the semiconductor layer.

In an implementation form, the APD device further comprises: a first contact formed on the first contact region and a second contact formed on the second contact region.

The first contact and the second contact (e.g., metal contacts) can be used to apply a bias across the lateral diode formed in the APD device.

The APD device of the first aspect and its implementation forms may be a lateral SACM APD device.

The APD device 40 may be a lateral SACM APD device.

Notably, in this disclosure, the terms "above" or "on" with respect to layers or regions of the APD device may mean that these are arranged vertically, i.e., along the formation/ growth direction of the APD device. Terms "adjacent" or "between" in the same layer may mean that these are arranged laterally, i.e., perpendicular to the growth direction of the APD device. Lateral may be in the plane or parallel to the plane of a layer, e.g., the plane of the semiconductor layer. In the figures, the vertical direction is from bottom to top of the figure, and the lateral direction is from left to right and/or into the plane of the figure.

A second aspect of the present disclosure provides a method for forming an APD device, wherein the method comprises: forming a first contact region and a second contact region in a semiconductor layer; forming an absorption region on the semiconductor layer, wherein the absorption region is at least partly formed on a first region of the semiconductor layer, wherein the first region is arranged between the first contact region and the second contact region; forming a charge region in the semiconductor layer between the first region and the second contact region; and forming an amplification region in the semiconductor layer between the charge region and the second contact region; wherein the absorption region is formed curved on the semiconductor layer.

The method of the second aspect achieves the same benefits as the device of the first aspect and may be extended by respective implementations as described above for the device of the first aspect.

BRIEF DESCRIPTION OF THE DRAWINGS

The above described aspects and implementations (embodiments of the disclosure) are explained in the following description of embodiments with respect to the enclosed drawings.

DETAILED DESCRIPTION OF EMBODIMENTS OF THE DISCLOSURE

Figure 1:
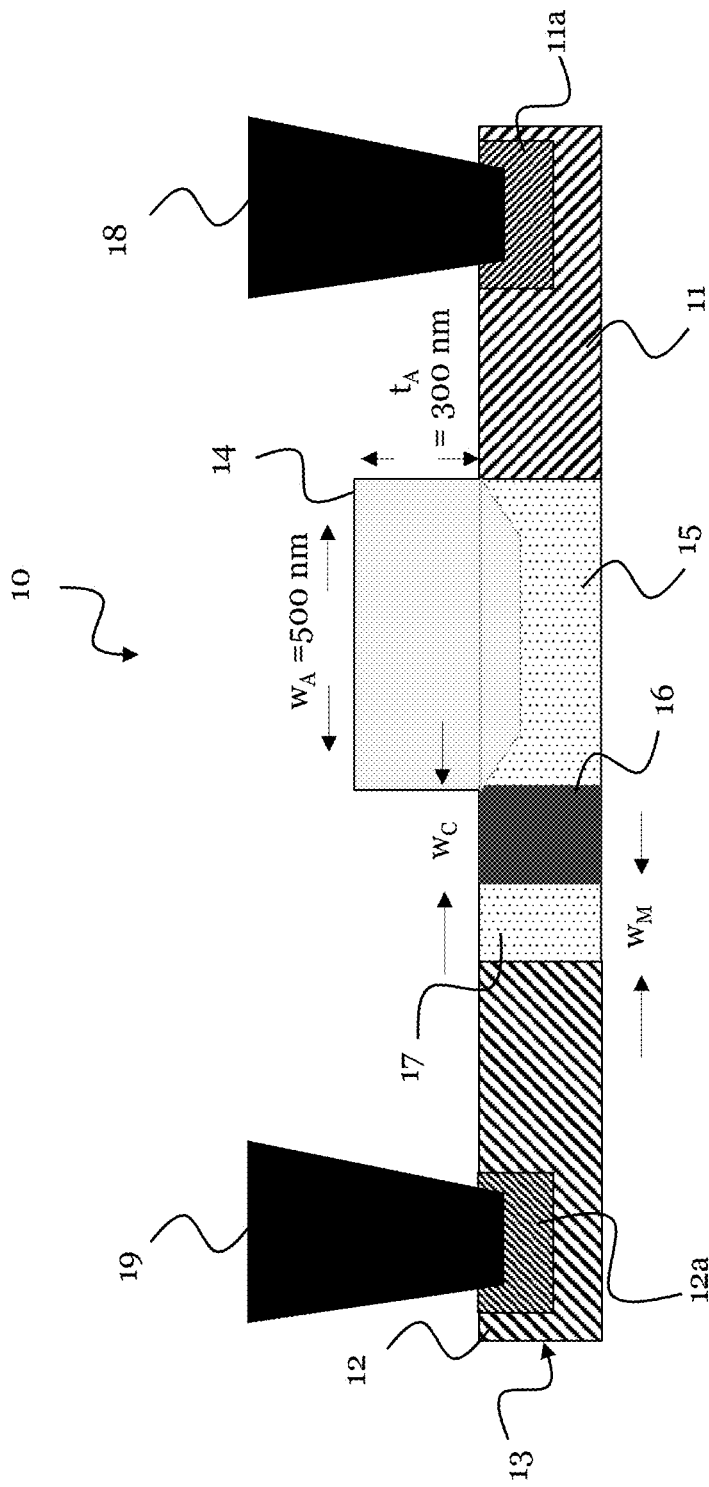
FIG. 1 shows an exemplary APD device.
Figure 2:
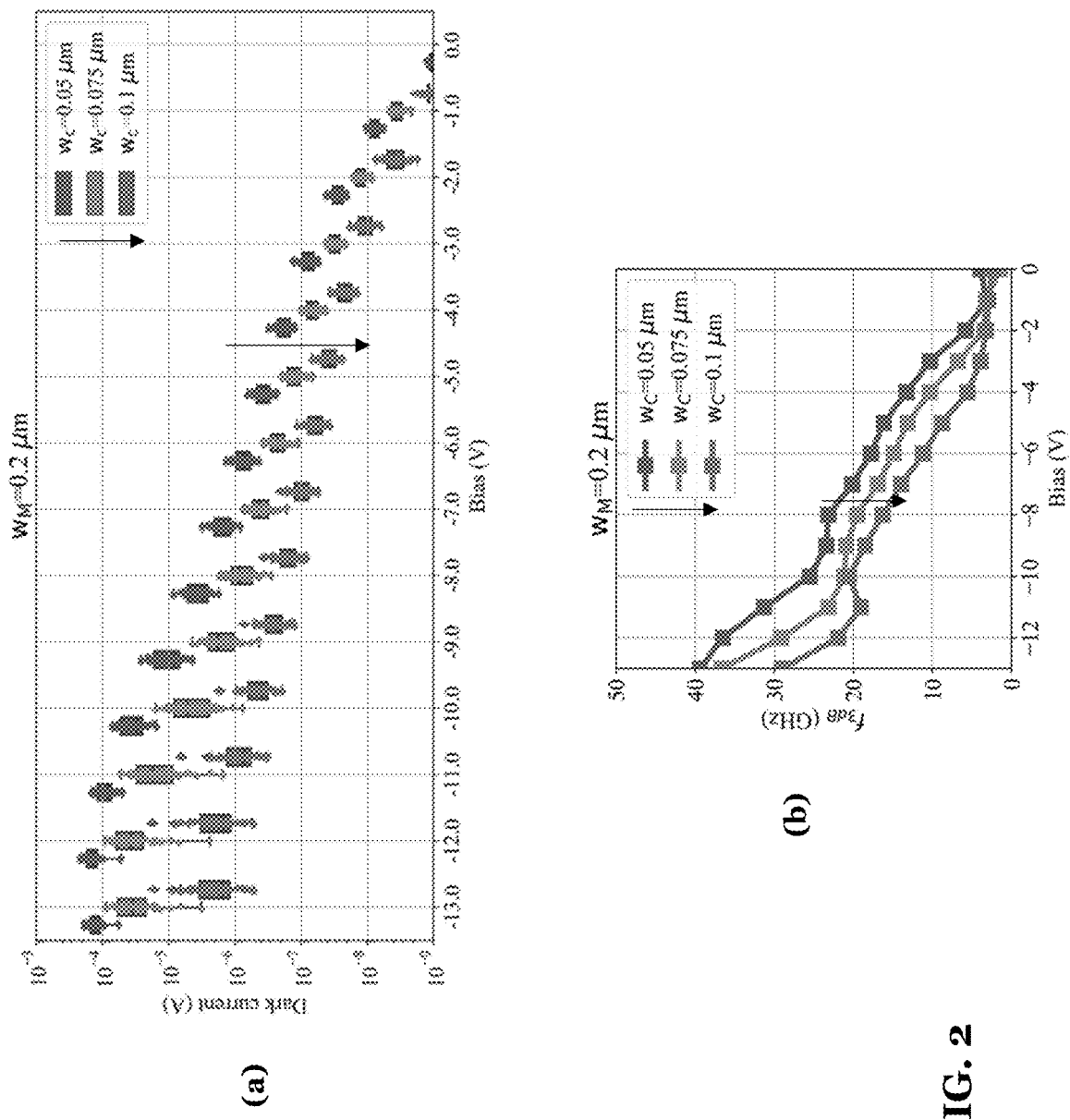
FIG. 2, parts (a) and (b), shows an influence of the charge region width on the dark current and the bandwidth of the exemplary APD device.
Figure 3:
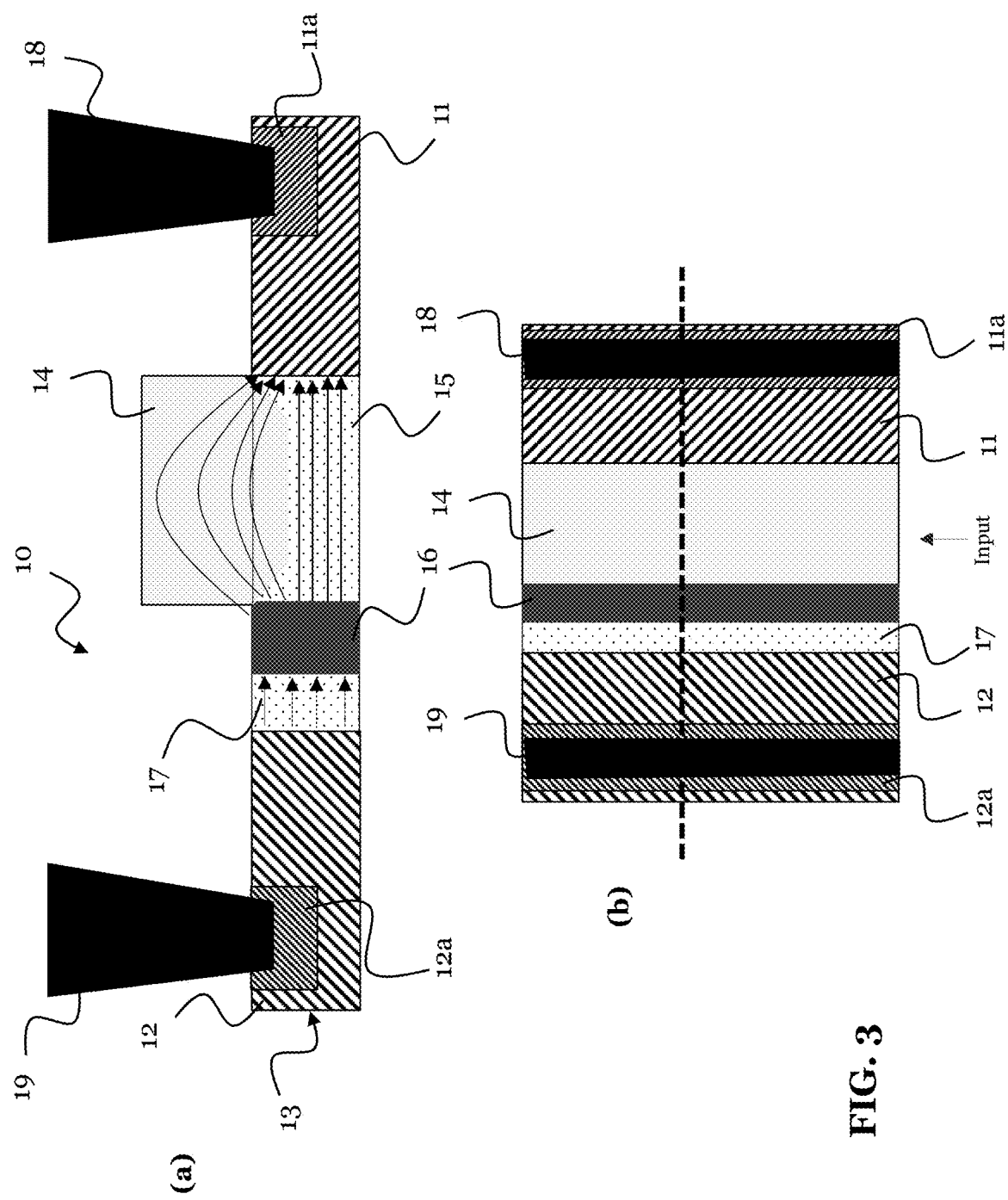
FIG. 3, parts (a) and (b), shows an electric field distribution in the exemplary APD device.
Figure 4:
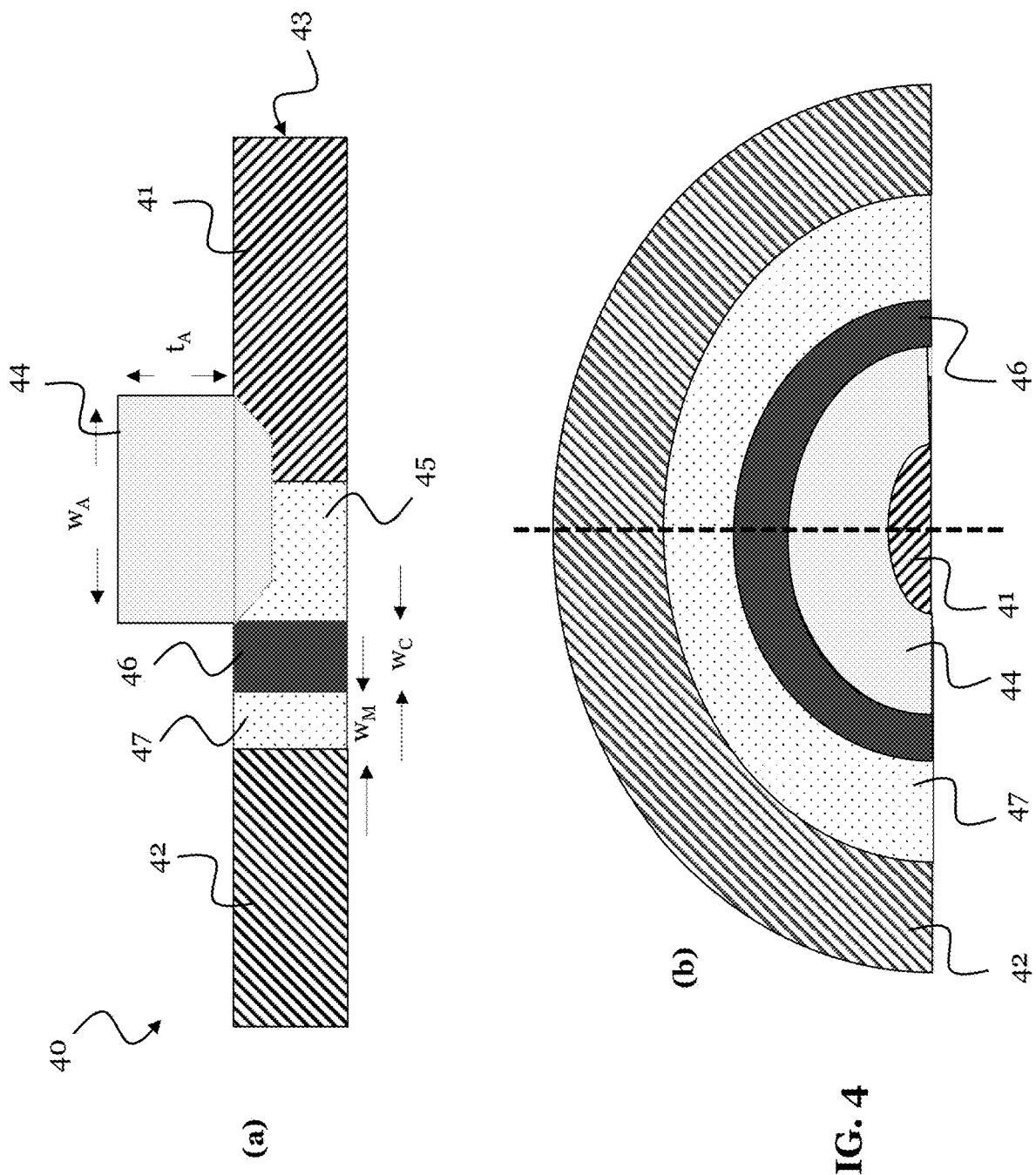
FIG. 4, parts (a) and (b), shows an APD device according to an embodiment of the disclosure.

FIG. 4 shows an APD device 40 according to an embodiment of the disclosure. In particular, FIG. 4, part (b), shows a top view of the APD device 40, and FIG. 4, part (a), shows a cross-section of the APD device 40 along the dashed line in FIG. 4, part (b).

The APD device 40 comprises a first contact region 41 and a second contact region 42, which are formed in a semiconductor layer 43. The semiconductor layer 43 may be a silicon layer, e.g., may be the top layer of a silicon-on-insulator (SOI) substrate. The first contact region 41 may be a p-doped region, and the second contact region 42 may be an n-doped region.

The APD device 40 further comprises an absorption region 44 formed on the semiconductor layer 43, wherein the absorption region 44 is at least partly formed on a first region 45 of the semiconductor layer 43, wherein the first region 45 is arranged between the first contact region 41 and the second contact region 42. The first region 45 may be an intrinsic region of the semiconductor layer 43. The absorption region 44 may comprise germanium, particularly intrinsic and/or doped germanium.

Further, the APD device 40 comprises a charge region 46 formed in the semiconductor layer 43 between the first region 45 and the second contact region 42, and comprises an amplification region 47 (or multiplication region 47, these terms are equivalent in this disclosure) formed in the semiconductor layer 43 between the charge region 46 and the second contact region 42. The charge region 46 may be a doped region of the semiconductor layer 43, e.g., may be of the same conductivity type as the first contact region 41, e.g., may be p-doped. The amplification region 47 may be an intrinsic region of the semiconductor layer 43.

The APD device 40 may be a lateral SACM APD device, since the absorption region 44, the charge region 46, and the multiplication region 47 may be formed laterally between the first contact region 41 and the second contact region 42. A width $w_M$ of the amplification region 47 may be in a range of 0.1-1 μm, and a width $w_C$ of the charge region 46 may be in a range of 50-300 nm, in particular 100-200 nm.

The absorption region 44 is curved on the semiconductor layer 43, for instance, as shown in FIG. 4, part (b). In particular, the curvature of the absorption region 44 may have a radius parallel to the layer plane of the semiconductor layer 43. The radius may be in the range of 1-10 μm, in particular may be in the range of 2-5 μm. The curvature of the absorption region 44 may reduce the carrier transit length, without the need to change the width and thickness of the absorption region 44. The width $W_A$ of the absorption region 44 may be in a range of 300-700 nm, particularly 450-550 nm, or about 500 nm. The thickness $t_A$ of the absorption region 44 may be in a range of 200-400 nm, particularly about 300 nm.

In addition to the absorption region 44, also the first contact region 41 and/or the second contact region 42, and/or the charge region 46, and/or the amplification region 47, may respectively be curved, in particular, in the layer plane of the semiconductor layer 43. As an example, FIG. 4 shows that the first contact region 41 and the second contact region 42 and the charge region 46 and the amplification region 47 are curved.

Figure 5:
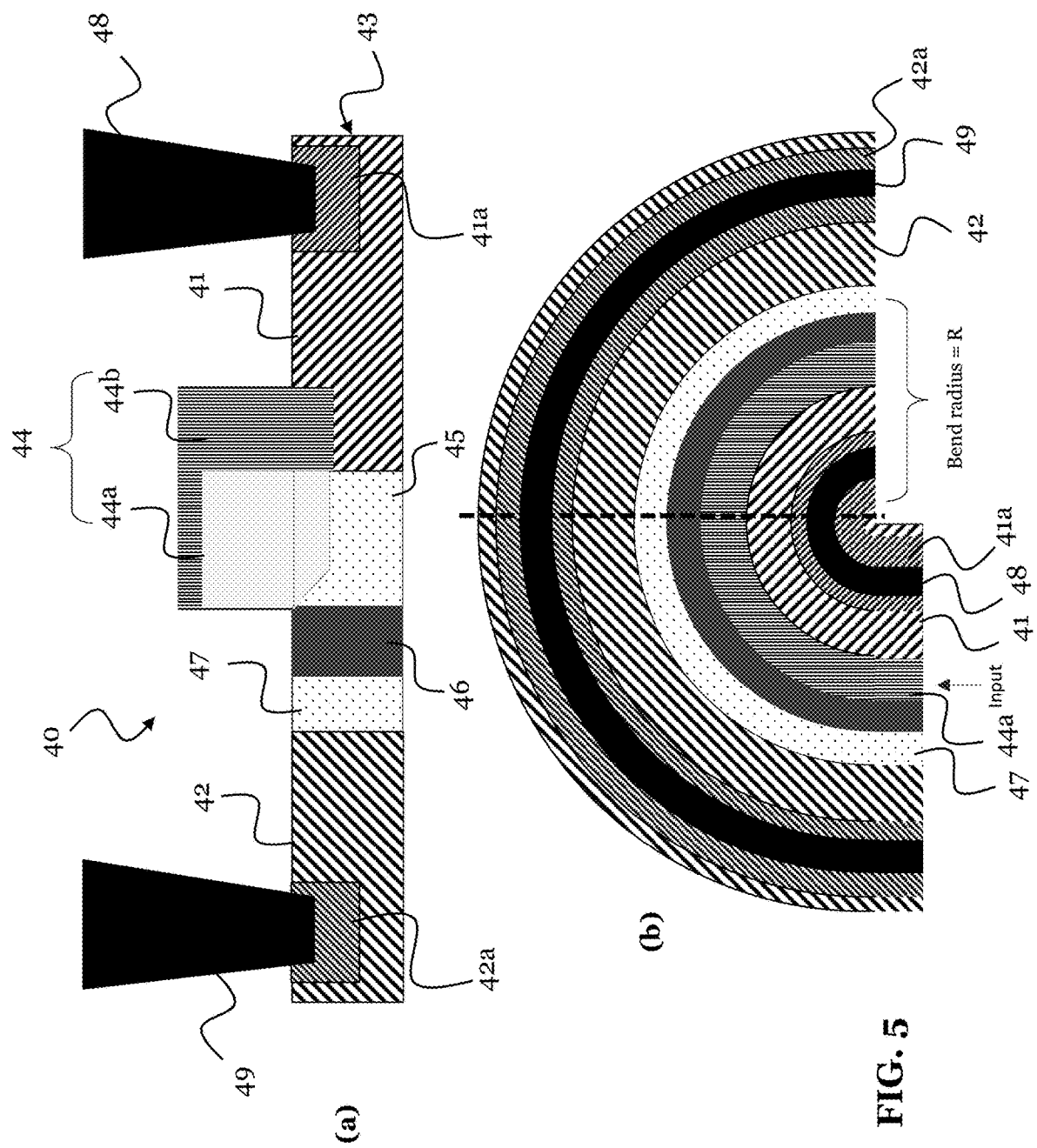
FIG. 5, parts (a) and (b), shows an APD device according to an embodiment of the disclosure.

FIG. 5 shows an APD device 40 according to an embodiment of the disclosure, which builds on the embodiment shown in FIG. 4. In particular, FIG. 5, part (b), shows a top view of the APD device 40, and FIG. 5, part (a), shows a cross-section of the APD device 40 along the dashed line in FIG. 5, part (b). Same elements in FIG. 4 and FIG. 5 shows the same reference signs and may be implemented likewise.

In particular in the embodiment shown in FIG. 5, the first contact region 41 and the second contact region 42, and the charge region 46, and the amplification region 47 are all curved in the layer plane of the semiconductor layer 43. Thereby, as exemplarily shown in the embodiment shown in FIG. 5, the curvatures of the amplification region 47, and of the first and second contact region 41 and 42, and of the charge region 46, are all concentric with the curvature of the absorption region 44. The APD device 40 of FIG. 5 has additional curved regions, as described below.

In particular, the APD device 40 may include a first contact 48 provided on the first contact region 41, in particular provided on a highly-doped region 41a of the first contact region 41. The APD device 40 may also include a second contact 49 provided on the second contact region 42, in particular provided on a highly-doped region 42a of the second contact region 42. The first and second contacts 48 and 49 allow applying a bias to the diode, which is laterally formed in the semiconductor layer 43. The first contact 48 and/or the second contact and/or the highly-doped region 51 of the first contact region 41 and/or the highly-doped region 42a of the second contact region 42 may be curved. In FIG. 5, all of these regions are curved, in particular with the same curvature as the regions 41, 42, 46 and 47.

It is further shown in FIG. 5 that the absorption region 44 comprises an intrinsic part 44a and a doped part 44b arranged side by side. The doped part 44b of the absorption region 44 may be of the same conductivity type as the first contact region 41 and the charge region 46, respectively. In particular, the doped part 44b may be p-doped like the first contact region 41 and the charge region 47. In this case, the second contact region 42 is n-doped. The amplification region 47 may be intrinsic (intrinsic in this disclosure may also be referred to as not intentionally doped (NID)). The absorption region 44 is partly formed on the first region 45 and is partly formed on the first contact region 41. Thereby, the intrinsic part 44a is formed on the first region 45, and the doped part 44b is formed on the first contact region 41. Moreover, the upper surface of the absorption region 44 is formed by the doped part 44b. The free surfaces of the absorption region 44, e.g. the upper surface, may be covered by an oxide. The intrinsic part 44a as well as the doped part 44b may be curved as illustrated.

The doping profile of the absorption region 44 may make the electric field in the absorption region 44 more uniform. The doped part 44b, in particular when it forms the upper surface of the absorption region 44, may further reduce the number of absorption material/oxide interfaces of the absorption region 44, which are exposed to an electric field.

Figure 6:
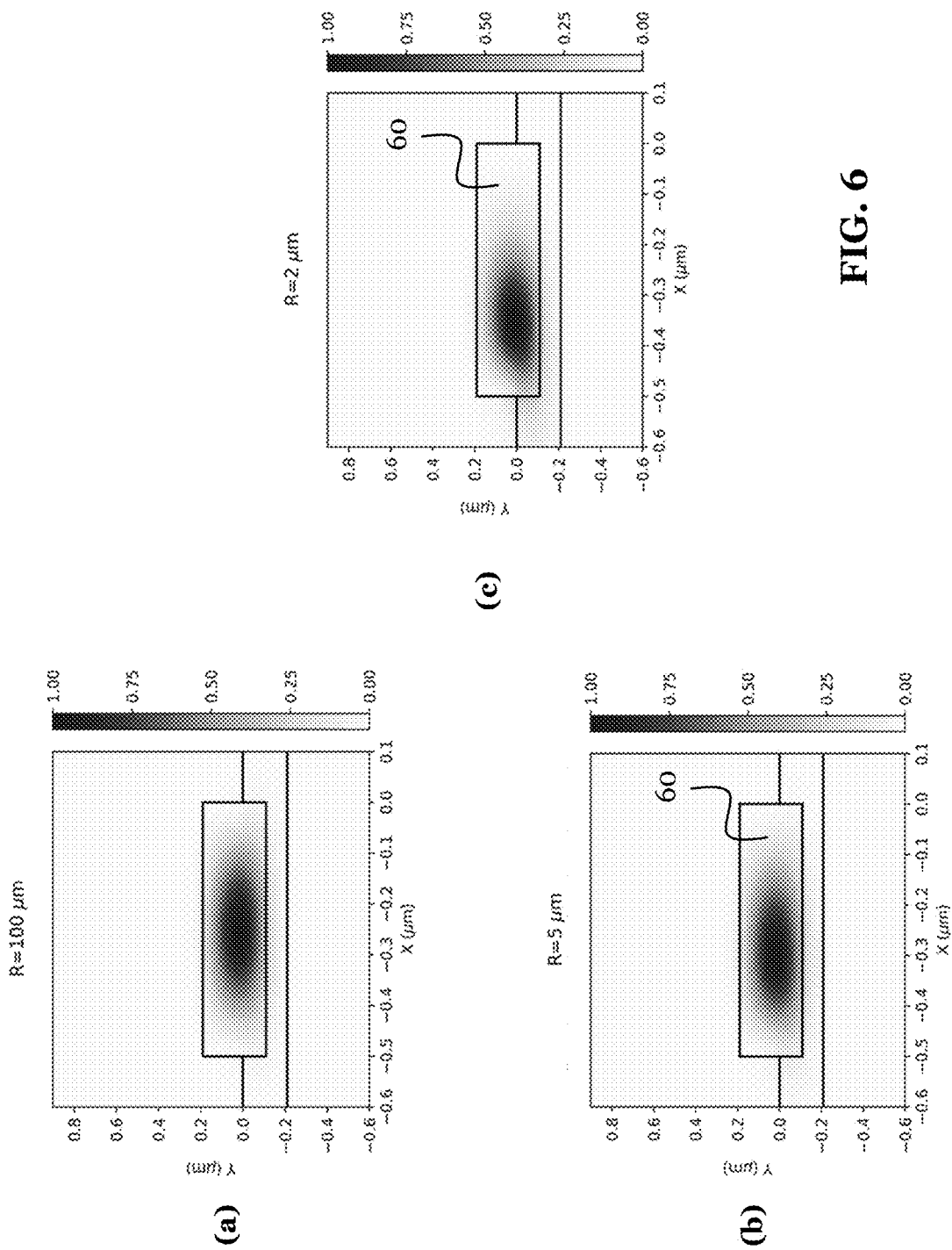
FIG. 6, parts (a) to (c), shows an optical mode in the absorption region of an exemplary APD device (without significant curvature), and in the absorption region of APD devices according to embodiments of the disclosure (with significant curvature).

FIG. 6 shows simulations of optical modes in different exemplary absorption regions. In particular, FIG. 6, part (a), shows the optical mode in an exemplary absorption region 14 of the APD device 10, i.e. with no significant curvature (here a very large and thus insignificant curvature radius of 100 μm is assumed). FIG. 6, parts (b) and (c), shows the optical modes in exemplary absorption regions 44 of the APD device 40 according to embodiments of the disclosure, i.e., with curvature, in particular for a curvature radius of 5 μm (FIG. 6, part (b)) and of 2 μm (FIG. 6, part (c)). It can be seen that the smaller the radius, the stronger the optical mode shifts away from the center of the absorption region 44. For the straight absorption region 14 (or without significant curvature), the optical mode is located in the center of the absorption region 14. For the curved absorption region 44 with the bend radius of 5 μm and 2 μm, the optical mode is moved towards the edge of the absorption region 44. This opens a region 60 in the absorption region 44, which allows for adding a doping to improve the electric field distribution in the absorption region 44. In particular, the doped part 44b can be formed in the region 60, where the optical mode is not significant, and the intrinsic part 44a can be formed where the optical mode is mainly located, due to the curvature of the absorption region 44.

Figure 7:
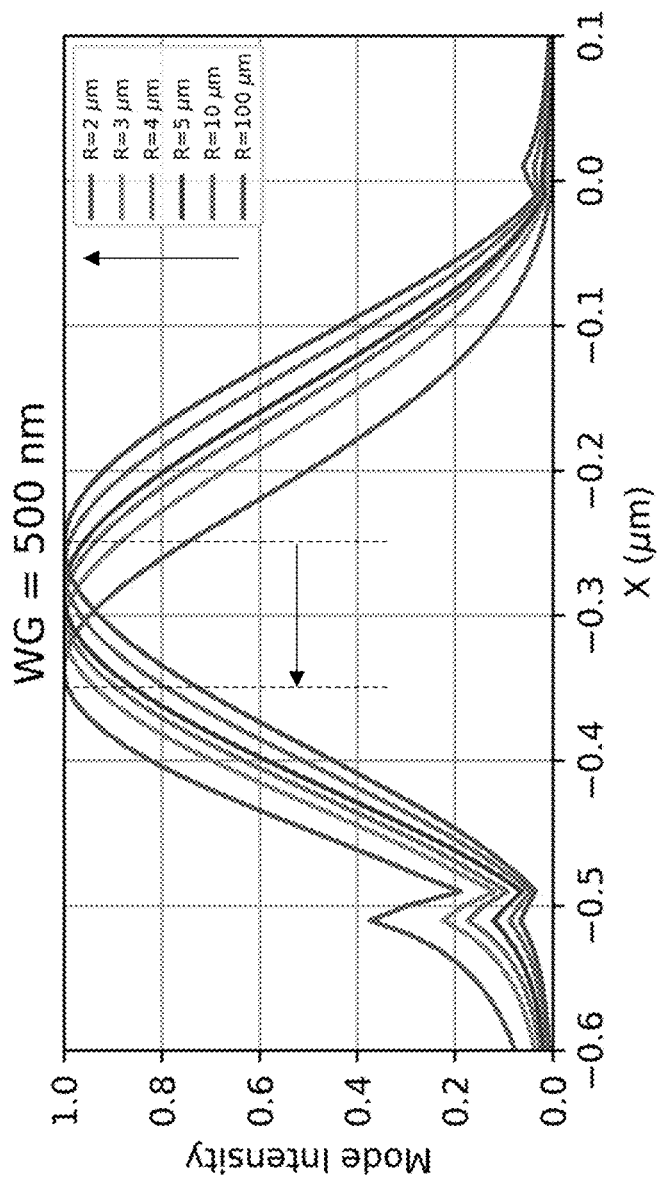
FIG. 7 shows a shift of an optical mode in the absorption region in dependence of a curvature radius of the absorption region.

FIG. 7 shows a shift of an optical mode in the absorption region 44 in dependence to its curvature (indicated by the arrows). In this case, the absorption region 44 width $W_A$ was 500 nm and made of germanium. It can particularly be seen from FIG. 7 that the peak optical mode shifts by more than 100 nm towards the edge of the absorption region 44, when decreasing the curvature radius of the absorption region 44 from 100 μm to 2 μm. Here, a 500 nm wide absorption region 44 was assumed. In such an absorption region 44, the optical mode covers around 300-400 nm of light. This gives a room (region 60 in FIG. 6) of 100-200 nm for adding a doping to the absorption region 44, i.e. for forming the doped part 44b.

Figure 8:
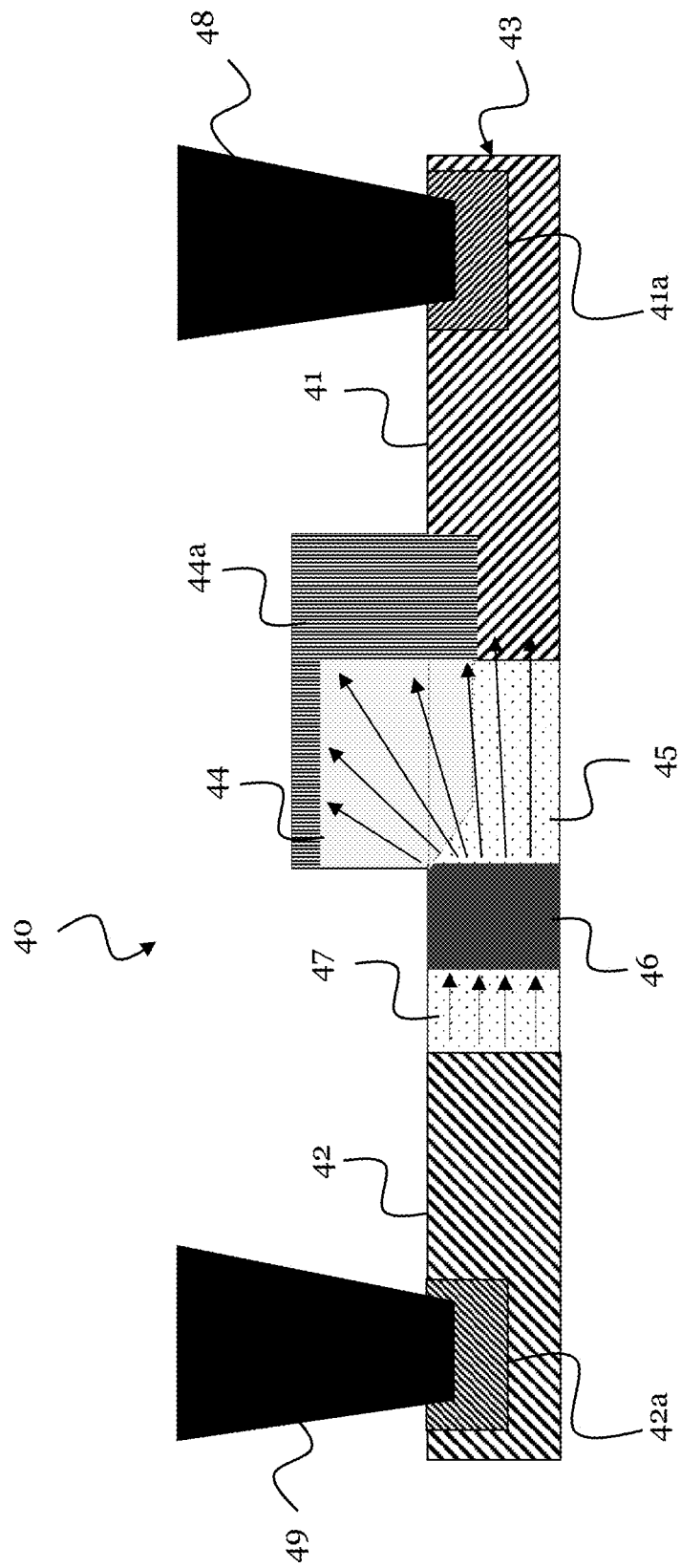
FIG. 8 shows an electric field distribution in the APD device according to an embodiment of the disclosure.

FIG. 8 shows an electric field distribution in the APD device 40 according to an embodiment of the disclosure, as it is shown in FIG. 5. One benefit of the APD device 40 is that the charge region 46 can be made wider than in the exemplary APD device 10. This can be done, since with the curved absorption region 44 and the doping profile of the absorption region 44, i.e., the intrinsic part 44a and the doped part 44b, a more uniform electric field distribution is achieved in the absorption region 44, compared to the absorption region 14 of the exemplary APD device 10. Further, since two (intrinsic) absorption region/oxide interfaces that exist in the exemplary APD device 10 are covered with doping, i.e., no electrical field exists there. Consequently, a dark current can be reduced in the APD device 40 while the bandwidth is increased (or at least maintained).

Figure 9:
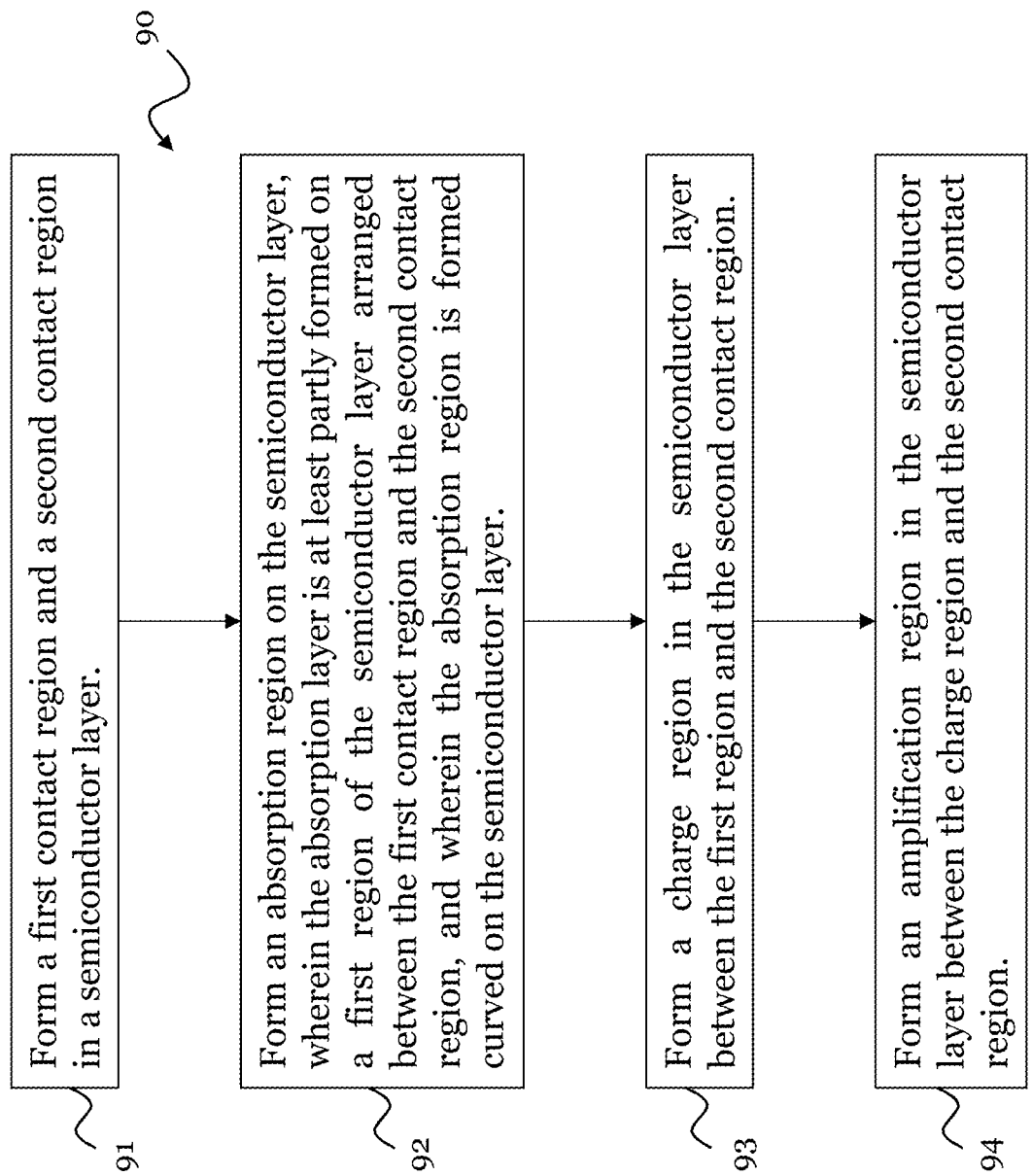
FIG. 9 shows a method according to an embodiment of the disclosure.

FIG. 9 shows a method 90 according to an embodiment of the disclosure. The method 90 is for forming an APD device 40, as shown in FIG. 4, 5 or 8. The method 90 is illustrated in a flow-diagram and comprises a step 91 of forming a first contact region 41 and a second contact region 42 in a semiconductor layer 43. Further, it comprises a step 92 of forming an absorption region 44 on the semiconductor layer 43, wherein the absorption region 44 is at least partly formed on a first region 45 of the semiconductor layer 43, wherein the first region 45 is arranged between the first contact region 41 and the second contact region 42. The absorption region 44 is formed curved on the semiconductor layer 43. Further, the method 90 comprises a step 93 of forming a charge region 46 in the semiconductor layer 43 between the first region 45 and the second contact region 42. Further, the method 90 comprises a step 94 of forming an amplification region 47 in the semiconductor layer 43 between the charge region 46 and the second contact region 42.

In summary, the above described embodiments of the disclosure provide several benefits. For instance, the APD device 40 can be easy to implement as it is compatible with designs with mask layers, unlike other APD devices (vertical) that require dedicated epitaxy for the stacks to be implemented. Further, the APD device 40 has less dark current with increased or same bandwidth than the APD device 10.

Embodiments of the disclosure, particularly the APD device 40 and the method 90, can be used to realize avalanche photodetectors, photodetectors and single photon avalanche photodetectors, which may all benefit from the improvement of the dark current and device bandwidth tradeoff. These devices are typically used in applications such as optical interconnections, optical communication, local optical quantum computing, quantum communication, terahertz communication, terahertz imaging, sensing, etc.

The invention claimed is:

1. An avalanche photodiode (APD) device comprising:
   a first contact region and a second contact region formed in a semiconductor layer;
   an absorption region formed on the semiconductor layer, the absorption region comprising an intrinsic part and a doped part arranged side by side, wherein the absorption region is at least partly formed on a first region and the first contact region of the semiconductor layer, wherein the first region is arranged between the first contact region and the second contact region, wherein the intrinsic part is formed on the first region and the doped part is formed on the first contact region, wherein an upper surface of the absorption region is formed by the doped part, and wherein the absorption region is curved on the semiconductor layer;

a charge region formed in the semiconductor layer between the first region and the second contact region; and an amplification region formed in the semiconductor layer between the charge region and the second contact region.

2. The APD device according to claim 1, wherein:
a curvature of the absorption region has a radius parallel to a layer plane of the semiconductor layer.

3. The APD device according to claim 1, wherein:
a curvature of the absorption region has a radius in a range of 1-10 µm.

4. The APD device according to claim 3, wherein:
the radius of the curvature of the absorption region is in a range of 2-5 µm.

5. The APD device according to claim 1, wherein:
the first contact region and the second contact region, and/or the charge region, and/or the amplification region are curved in a layer plane of the semiconductor layer.

6. The APD device according to claim 5, wherein:
a curvature of the amplification region, and/or of the first and second contact region, and/or of the charge region, is concentrical with a curvature of the absorption region.

7. The APD device according to claim 1, wherein:
the doped part of the absorption region is of a same conductivity type as the first contact region.

8. The APD device according to claim 7, wherein:
the doped part is a p-type doped part.

9. The APD device according to claim 1, wherein:
the absorption region comprises germanium.

10. The APD device according to claim 1, wherein:
the absorption region comprises intrinsic germanium and doped germanium.

11. The APD device according to claim 1, wherein the absorption region is formed in an indentation of the semiconductor layer.

12. The APD device according to claim 11, wherein the indentation spans the first region and a part of the first contact region.

13. The APD device according to claim 1, wherein:
a width of the amplification region is in a range of 0.05-1 µm; and/or
a width of the charge region is in a range of 0.05-0.3 µm.

14. The APD device according to claim 1, wherein:
the amplification region is formed by an intrinsic region of the semiconductor layer.

15. The APD device according to claim 1, further comprising:
a first contact formed on the first contact region and a second contact formed on the second contact region.

16. The method according to claim 15, wherein:
a curvature of the absorption region has a radius parallel to a layer plane of the semiconductor layer.

17. A method for forming an APD device, wherein the method comprises:
forming a first contact region and a second contact region in a semiconductor layer;
forming an absorption region on the semiconductor layer, the absorption region comprises an intrinsic part and a doped part arranged side by side, wherein the absorption region is at least partly formed on a first region and the first contact region of the semiconductor layer, wherein the first region is arranged between the first contact region and the second contact region, wherein the intrinsic part is formed on the first region and the doped part is formed on the first contact region, wherein an upper surface of the absorption region is formed by the doped part, and wherein the absorption region is formed curved on the semiconductor layer;
forming a charge region in the semiconductor layer between the first region and the second contact region; and
forming an amplification region in the semiconductor layer between the charge region and the second contact region.

* * * * *